(12) United States Patent
Toprac et al.

(10) Patent No.: US 6,706,541 B1
(45) Date of Patent: *Mar. 16, 2004

(54) METHOD AND APPARATUS FOR CONTROLLING WAFER UNIFORMITY USING SPATIALLY RESOLVED SENSORS

(75) Inventors: Anthony J. Toprac, Austin, TX (US); Michael L. Miller, Cedar Park, TX (US)

(73) Assignee: Advanced Micro Devices, Inc., Austin, TX (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 364 days.

(21) Appl. No.: 09/421,803

(22) Filed: Oct. 20, 1999

(51) Int. Cl.$^7$ .............................. H01L 21/00
(52) U.S. Cl. ................. 438/7; 438/14; 438/16
(58) Field of Search ................. 438/16, 14, 7; 374/128, 110, 124; 427/8, 9, 10

(56) References Cited

U.S. PATENT DOCUMENTS

| | | | | |
|---|---|---|---|---|
| 4,331,702 A | * | 5/1982 | Hieber et al. | 427/10 |
| 5,937,142 A | | 8/1999 | Moslehi et al. | 392/416 |
| 5,983,906 A | * | 11/1999 | Zhao et al. | 134/1.1 |
| 6,071,811 A | * | 6/2000 | Ngan | 438/648 |
| 6,123,766 A | * | 9/2000 | Williams et al. | 117/85 |
| 6,162,488 A | * | 12/2000 | Gevelber et al. | 427/8 |

FOREIGN PATENT DOCUMENTS

| | | |
|---|---|---|
| JP | 60245778 | 12/1985 |
| JP | 07316811 | 12/1995 |
| JP | 11222673 | 8/1999 |
| WO | WO 97/04478 | 2/1997 |

OTHER PUBLICATIONS

International Search Dated Sep. 14, 2000 (PCT/US00/10364; TT3273–PCT).

* cited by examiner

*Primary Examiner*—Hsien-Ming Lee
(74) *Attorney, Agent, or Firm*—Williams, Morgan & Amerson, P.C.

(57) ABSTRACT

A processing system includes a sensor, a processing tool, and an automatic process controller. The sensor has a plurality of sensing regions. The processing tool is adapted to process at least one process layer on a wafer. The process tool includes a process control device controllable by a process control variable. The sensor is adapted to measure a process layer characteristic of the process layer in a selected one of the sensing regions. The automatic process controller is adapted to receive the process layer characteristics measured by the sensor and adjust the process control variable in response to the process layer characteristic measured in one sensing region differing from the process layer characteristic measured in another sensing region. A method for controlling wafer uniformity includes processing a process layer on a wafer; measuring a characteristic of the layer in a plurality of sensing locations; and changing a process control variable of a process control device in response to the process layer characteristic measured in one sensing location differing from the process layer characteristic measured in another sensing location to affect the rate of processing the process layer in at least one of the sensing locations.

20 Claims, 3 Drawing Sheets

METHOD AND APPARATUS FOR CONTROLLING WAFER UNIFORMITY USING SPATIALLY RESOLVED SENSORS

BACKGROUND OF THE INVENTION

1. Field of the Invention

This invention relates generally to semiconductor manufacture, and more particularly, to a method and apparatus for controlling wafer uniformity using spatially resolved sensors.

2. Description of the Related Art

In the manufacture of semiconductor devices, wafers, such as silicon wafers, are subjected to a number of processing steps. The processing steps include depositing or forming layers, patterning the layers, and removing portions of the layers to define features on the wafer. One such process step is the formation of a layer by chemical vapor deposition, where reactive gases are introduced into a vessel containing the semiconductor wafers. The reactive gases facilitate a chemical reaction that causes a layer to form on the wafers.

Commonly, variation in the thickness of the deposited layer exists across the wafer. For example, the thickness of the layer deposited on the periphery may be greater or less than the thickness of the layer deposited in the center of the wafer. Such thickness variations, if sufficiently large, may result in defects in the various die defined on the wafer. Thickness variation across the wafer also complicates subsequent processing of the wafer. For example, strip times or polish times are designed based on an assumed or designed thickness of the previously formed layers. If the thickness in a certain region is sufficiently less than the design thickness, an over-strip or over polish may occur, thus damaging the underlying topology.

The present invention is directed to overcoming, or at least reducing the effects of, one or more of the problems set forth above.

SUMMARY OF THE INVENTION

One aspect of the present invention is seen in a processing system including a sensor, a processing tool, and an automatic process controller. The sensor has a plurality of sensing regions. The processing tool is adapted to process at least one process layer on a wafer. The process tool includes a process control device controllable by a process control variable. The sensor is adapted to measure a process layer characteristic of the process layer in a selected one of the sensing regions. The automatic process controller is adapted to receive the process layer characteristics measured by the sensor and adjust the process control variable in response to the process layer characteristic measured in one sensing region differing from the process layer characteristic measured in another sensing region.

Another aspect of the present invention is seen in a method for controlling wafer uniformity. The method includes processing a process layer on a wafer; measuring a characteristic of the layer in a plurality of sensing locations; and changing a process control variable of a process control device in response to the process layer characteristic measured in one sensing location differing from the process layer characteristic measured in another sensing location to affect the rate of processing the process layer in at least one of the sensing locations.

BRIEF DESCRIPTION OF THE DRAWINGS

The invention may be best understood by reference to the following description taken in conjunction with the accompanying drawings, in which like reference numerals identify like elements, and in which.

Figure 1:
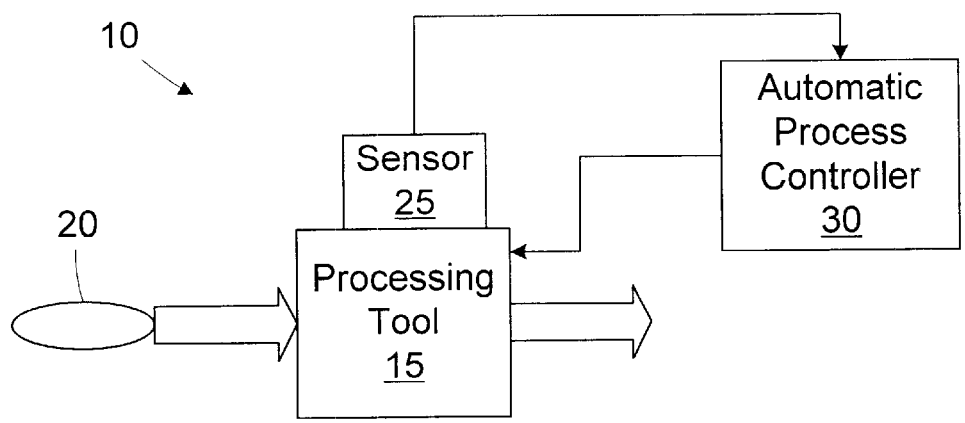
FIG. 1 is a simplified block diagram of a processing system in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring now to the Figures, and in particular, to FIG. 1, a simplified block diagram of a processing system 10 is provided. The processing system 10 includes a processing tool 15 adapted to receive a wafer 20 (i.e., or a lot of wafers 20) and perform at least one processing task on the wafer 20. The specific processing task performed by the processing tool 15 may vary, however, exemplary functions include chemical vapor deposition, thermal oxide layer growth, etching, or some other process resulting in the formation or removal of a layer. A sensor 25 is mounted proximate the processing tool 15 for measuring the uniformity of the process being performed on the wafer 20. Generally, the uniformity of the wafer 20 is consistent along a path having the same radius. For example, the thickness of a process layer being deposited is generally consistent about the periphery of the wafer 20, and the thickness in the center is generally consistent in the center, yet the thickness may vary between the center and the periphery. The thickness of the process layer in the intermediate region between the periphery and the center may also vary from the other regions. The sensor is adapted to measure the thickness of the process layer in two or more regions and provide thickness feedback to an automatic process controller 30. The automatic process controller 30 adjusts the recipe controlling the processing tool 15 in response to thickness variation to affect uniformity across the wafer 20.

Figure 2:
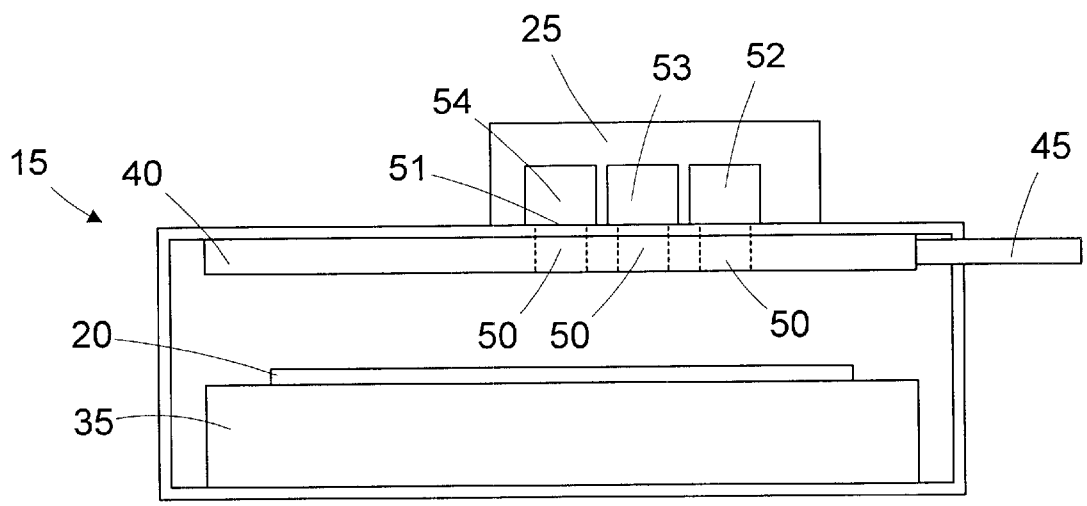
FIG. 2 is a side view of one embodiment of the processing tool and sensor of FIG. 1.

Turning now to FIG. 2, a side view of one embodiment of the processing tool 15 and sensor 25 of FIG. 1 is provided.

The depiction of the processing tool 15 is provided for illustrative purposes and is not intended to show all aspects of an actual processing apparatus. In the embodiment of FIG. 2, the processing tool 15 is adapted to deposit a layer of material on the wafer 20. The processing tool 15 includes a heating element 35 adapted to heat the wafer 20. The specific temperature of the heating element 35 depends on the particular process performed by the processing tool 15. Various processes and their associated temperatures are known to those of ordinary skill in the art.

A gas manifold 40 introduces reactive gases from a gas line 45 into the processing tool 15. Again, as known to those of ordinary skill, the specific process gases and their concentrations depend on the particular process being performed.

Sensor ports 50, including permeable or semi-permeable membranes 51, extend through the processing tool 15 and the gas manifold 40 to allow the sensor 25 to monitor the wafer 20. Alternatively, the sensor 25 may be located within the processing tool 15 in a position that does not interfere with the gas manifold 40. For some processes, it is contemplated that the processing tool 15 may include only one of the heating element 35 and the gas manifold 40. The sensor 25 includes sensing elements 52, 53, 54 for measuring uniformity characteristics of the wafer 20 at different points on the wafer 20. It is contemplated that more or less sensing elements 52, 53, 54 may be provided depending on the degree to which control of the radial uniformity is desired.

Figure 3:
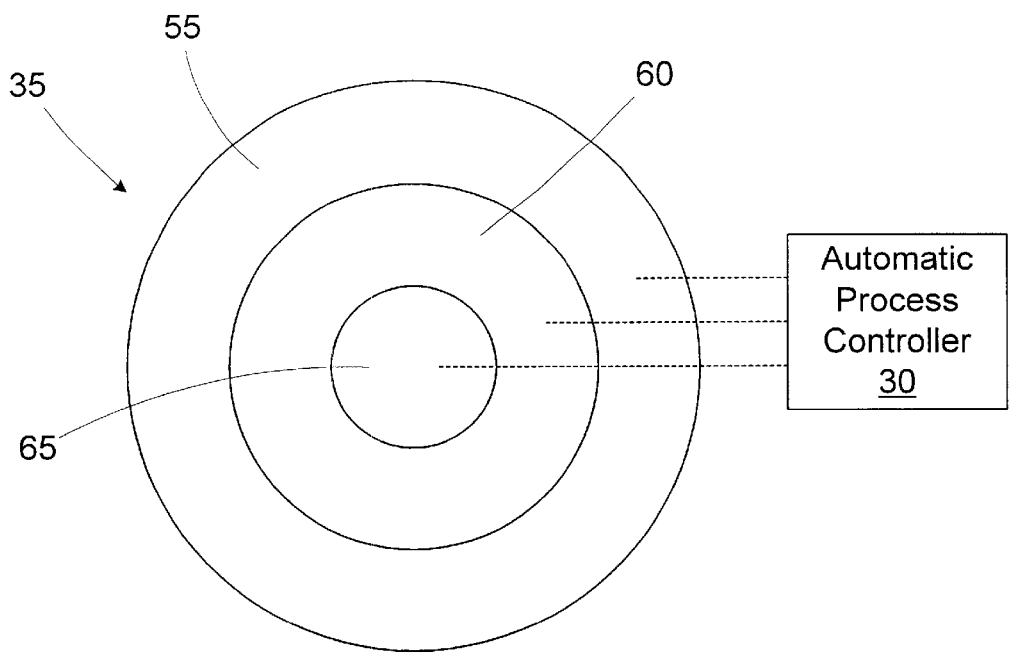
FIG. 3 is a top view of a heating element of the processing tool of FIG. 2.

Referring to FIG. 3, a top view of the heating element 35 is provided. The heating element 35 includes three concentric regions 55, 60, 65, each of which are each independently controllable. The three regions 55, 60, 65 correspond spatially to the location of the sensing elements 52, 53, 54. That is, the sensing element 52 is adapted to measure the thickness of the layer being formed in a position within the periphery region 55 of the heating element 35. Likewise, the center sensing element 54 measure the thickness in a position corresponding to the center region 65 of the heating element 35. It is contemplated that the number of regions 55, 60, 65 and corresponding sensing elements 52, 53, 54 may vary depending on the specific application and the degree to which control of the radial temperature gradient is desired. The automatic process controller 30 affects the set point temperatures of the regions 55, 60, 65 in response to uniformity variations detected by the sensor 25.

The sensor 25 may be one of several commonly available sensors capable of measuring the thickness of a deposited layer in situ. For example, the sensor 25 may be an optical interferometer or an optical emission spectrometer. The sensing elements 52, 53, 54 may be integrated in a single sensor 25, or alternatively, independent devices may be used. For slowly evolving processes, a single sensing element 52, 53, 54 could be automatically alternated between the sensor ports 50 to measure the thickness at each region 55, 60, 65.

During formation of a layer on the wafer 20, the sensing elements 52, 53, 54 monitor the thickness in their respective regions 55, 60, 65. The automatic process controller 30 adjusts the temperatures of one or more of the regions 55, 60, 65 on the heating element 35 based on variations in the measured thickness. For example, if the periphery sensing element 52 measures a thickness less than the intermediate or center sensing elements 53, 54, the automatic process controller 30 increases the temperature of the periphery region 55 of the heating element 35 to increase the deposition rate in that region 55. The amount of temperature increase and the rate at which the temperature is increased are dependent on the process being used to form the layer on the wafer 20. It is contemplated that the automatic process controller 30 may also lower the temperature of one of the heating element regions 55, 60, 65 to cause a decrease in the deposition rate.

Figure 4:
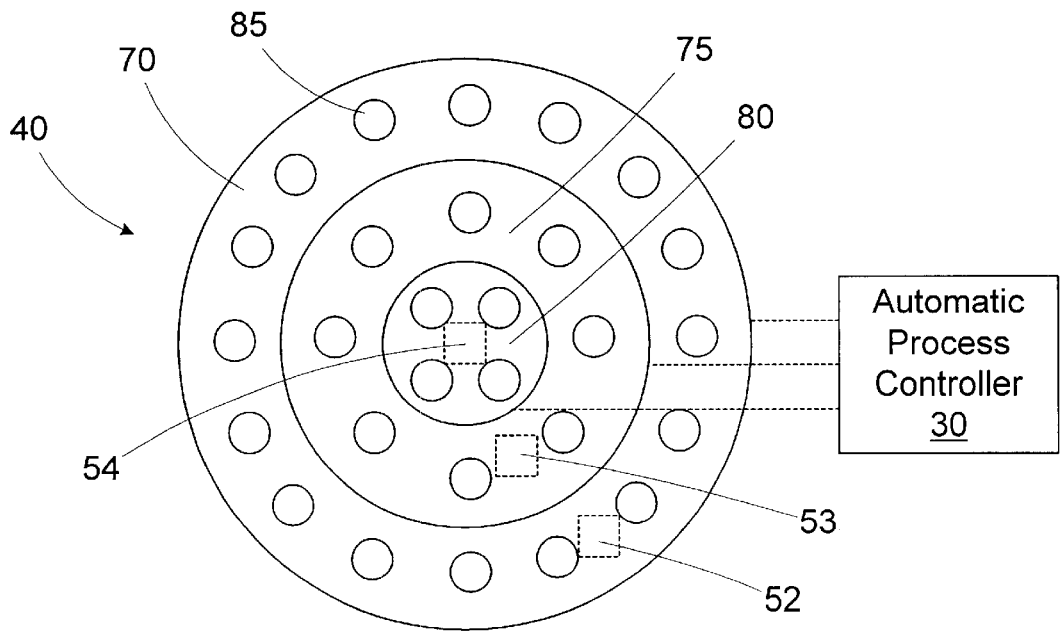
FIG. 4 is a bottom view of a gas manifold of the processing tool of FIG. 2.

Turning now to FIG. 4, a bottom view of the gas manifold 40 is provided. The gas manifold 40 includes concentric delivery headers 70, 75, 80 with ports 85 dispersed thereupon. Again, the depiction of the gas manifold 40 is provided for illustrative purposes and may vary from an actual device. The flow rate of the reactive gases through each of the headers 70, 75, 80 is independently controllable, and each of the headers 70, 75, 80 spatially corresponds to one of the sensing elements 52, 53, 54. It is contemplated that the number of regions 55, 60, 65 and corresponding sensing elements 52, 53, 54 may vary depending on the specific application and the degree to which control of the radial flow rate gradient is desired.

The sensor 25 measures the thickness of the layer being formed on the wafer 20 as described above and adjusts the flow rate of the reactive gas supplied through the headers 70, 75, 80 and impinging on the wafer 20 to control the uniformity of the layer. For example, if the periphery sensing element 52 measures a thickness less than the intermediate or center sensing elements 53, 54, the automatic process controller 30 increases the flow rate of the periphery header 70 of the gas manifold 40 to increase the deposition rate in the corresponding region. The amount of flow rate increase, and the rate at which the flow rate is increased, are dependent on the process being used to form the layer on the wafer 20. Again, it is contemplated that the automatic process controller 30 may lower the flow rate through one of the headers 70, 75, 80 to cause a decrease in the deposition rate.

As indicated above, the processing tool 15 may include both or only one of the heating element 35 and the gas manifold 40, generically referred to as process control devices 35, 40 to affect thickness uniformity of a process layer formed on the wafer 20. The automatic process controller 30 may be adapted to control only one or both of the process control devices 35, 40 to affect uniformity of the process layer formed on the wafer 20. The temperature and gas flow rate may be generically referred to as process control variables. Each process control variable is spatially related to one of the sensing elements 52, 53, 54. By independently controlling each of the process control variables, the automatic process controller 30 improves the uniformity of the wafer 20, thus increasing yield and simplifying subsequent processing.

Figure 5:
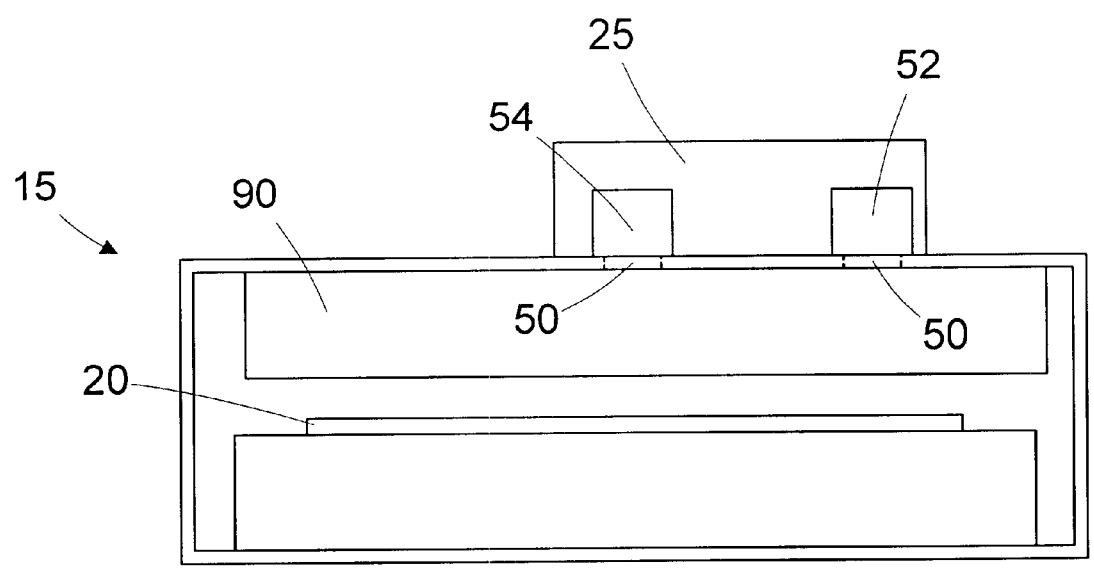
FIG. 5 is a side view of an alternative embodiment of the processing tool of FIG. 1.

Referring to FIG. 5, a simplified side view of another embodiment of the processing tool 15 is provided. In the embodiment of FIG. 5, the processing tool 15 does not have separate control regions, but the operating recipe of the processing tool 15 may be modified to affect wafer uniformity. A non-spatially resolved control variable is manipulated to achieve a spatially resolved process result. For example, in the case where the processing tool 15 is a plasma etch tool, experimental work captured in a mathematical model, shows that reducing plasma power in an etch process increases the rate of etch in the center relative to that at the edge. The specific relationship between power and etch rate is dependent on factors such as the particular etch tool and the recipe being used. The relationship for a particular configuration may be determined empirically and a mathematical model may be derived.

The sensor 25 is a two-point, spatially resolved sensor with sensing ports 50, one sensing element 52 on the edge, and one sensing element 54 in the center. A plasma generator 90 provides plasma for facilitating the strip process. The specific construct and operation of the plasma generator 90 are well known to those of ordinary skill in the art, and thus, are not described in detail. The power of the plasma generator 90 may be modified by the automatic process controller 30 to change the etch rate. For example, if the etch rate in the center differs from that at the edge, the mathematical model described above is used to change the plasma power by the amount necessary to equalize the etch rates. In the embodiment described in reference to FIG. 5, the plasma generator 90 functions as the process control device.

The control provided by the automatic process controller 30 may be implemented on a real-time or batch mode basis. In a real-time mode of operation, adjustments to the process control devices 35, 40, 90 are made to control the current deposition process in the processing tool 15. In the batch mode of operation, the automatic process controller 30 may update the recipe of the processing tool 15 for the next wafer or next lot of wafers based on the results obtained from the sensor 25. The batch mode of operation may be used when the processing tool 15 does not allow real-time recipe updates or when the response time of the sensor 25 is too slow to allow for real-time updates. For example, the signal from the sensor 25 may significantly lag the process, but by integrating the signal over time, a good characterization of the sum of processing on the wafer 20 (e.g., total thickness, or net etch rate) may be derived.

In addition to the feedback mode of operation described above, an additional embodiment of the invention incorporates a feed forward control action that compensates for nonuniform process results in previous operations. For example, the etching processing tool 15 of FIG. 5 may receive for processing a particular wafer or lot of wafers 20 having a characterized nonuniform deposited film thickness. For instance, one case may be that the wafer or wafers 20 may have a deposited process layer that is thicker in the center than at the edge. In such a case, configuring the processing tool 15 to etch at a higher etch rate in the center than at the edge of the wafer 20 evens out the layer thickness variation such that at the completion of the wafer etch, all open regions over the wafer surface are uniformly etched.

In such a feed forward mode of operation, data that characterizes spatial nonuniformity is gathered at a previous operation. The latest measured values of spatially distributed process rates (e.g., etch rates) at the present processing operation, along with the values of manipulated recipe variables used to achieve these results, are collected. A process model that quantifies the effect of the process recipe variable or variables on the spatially resolved uniformity of the current process (e.g., quantifies the effect of RF power on center to edge etch rate) is used to calculate the values of the manipulated variable necessary to compensate for the nonuniform results of previous operation(s). The automatic process controller 30 determines the appropriate recipe values for the given wafer or lot of wafers and configures the processing tool 15 accordingly.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for controlling wafer uniformity, comprising;
   processing a process layer on a wafer;
   measuring a thickness of the process layer in a plurality of sensing locations during the processing of the process layer to determine the surface uniformity of the process layer across the plurality of sensing locations; and
   autonomously changing a process control variable of a process control device based on the determined surface uniformity to affect the rate of processing the process layer in at least one of the sensing locations.

2. The method of claim 1, wherein the process control device has a plurality of control regions, each control region being associated with one of the sensing regions and having an associated process control variable, and autonomously changing the process control variable includes autonomously changing the process control variable of one of the control regions.

3. The method of claim 2, wherein the process control device comprises a heating element, and autonomously changing the process control variable includes autonomously changing the temperature associated with a selected control region of the heating element based on the determined surface uniformity of the process layer.

4. The method of claim 3, wherein autonomously changing the process control variable includes autonomously raising the temperature of the selected control region in response to the measured thickness of the process layer associated with the selected control region being less than the measured thickness of the process layer associated with another of the control regions.

5. The method of claim 3, wherein autonomously changing the process control variable includes autonomously lowering the temperature of the selected control region in response to the measured thickness of the process layer associated with the selected control region being greater than the measured thickness of the process layer associated with another of the control regions.

6. The method of claim 2, wherein the process control device comprises a gas manifold having a plurality of gas headers, each control region having an associated gas header, and autonomously changing the process control variable includes autonomously changing a gas flow rate associated with a selected gas header based on the determined surface uniformity of the process layer.

7. The method of claim 6, wherein autonomously changing the process control variable includes autonomously raising the gas flow rate of the selected gas header in response to the measured thickness of the process layer associated with the selected control region being less than the measured thickness of the process layer associated with another of the control regions.

8. The method of claim 6, wherein autonomously changing the process control variable includes autonomously lowering the gas flow rate of the selected gas header in response to the measured thickness of the process layer associated with the selected control region being greater than the measured thickness of the process layer associated with another of the control regions.

9. The method of claim 1, wherein the process control device comprises a plasma generator, and autonomously changing the process control variable includes autonomously changing the power of the plasma generator based on the determined surface uniformity.

10. The method of claim 9, wherein autonomously changing the process control variable includes autonomously raising the power of the plasma generator in response to the measured thickness of the process layer associated with one of the sensing regions being greater than the measured thickness of the process layer associated with another of the sensing regions.

11. The method of claim 9, wherein autonomously changing the process control variable includes autonomously lowering the power of the plasma generator in response to the measured thickness of the process layer associated with one of the sensing regions being less than the measured thickness of the process layer associated with another of the sensing regions.

12. The method of claim 1, wherein measuring the thickness includes measuring the thickness using at least one of an optical interferometer and an optical emission spectrometer.

13. The method of claim 1, wherein measuring the process layer characteristic includes measuring the process layer characteristic proximate the center of the wafer.

14. The method of claim 1, wherein measuring the process layer characteristic includes measuring the process layer characteristic proximate the periphery of the wafer.

15. The method of claim 1, wherein measuring the process layer characteristic includes measuring the process layer characteristic proximate the center of the wafer, proximate the periphery of the wafer, and intermediate the center and the periphery of the wafer.

16. The method of claim 1, wherein processing the process layer includes depositing the process layer on the wafer.

17. The method of claim 1, wherein processing the process layer includes etching the process layer on the wafer.

18. The method of claim 1, wherein autonomously changing the process control variable comprises autonomously adjusting the process control variable for a current wafer being processed by the processing tool.

19. The method of claim 1, wherein autonomously changing the process control variable comprises autonomously adjusting the process control variable for a subsequent wafer to be processed by the processing tool.

20. A processing tool, comprising:
   means for processing a process layer on a wafer;
   means for measuring a thickness of the process layer in a plurality of sensing locations during the processing of the process layer to determine the surface uniformity of the process layer across the plurality of sensing locations; and
   means for autonomously changing a process control variable of a process control device based on the determined surface uniformity of the process layer to affect the rate of processing the process layer in at least one of the sensing locations.

* * * * *